US009362100B2

(12) United States Patent
Martínez Jarquín et al.

(10) Patent No.: US 9,362,100 B2
(45) Date of Patent: Jun. 7, 2016

(54) NON-THERMAL PLASMA JET DEVICE AS SOURCE OF SPATIAL IONIZATION FOR AMBIENT MASS SPECTROMETRY AND METHOD OF APPLICATION

(71) Applicant: CENTRO DE INVESTIGACIÓN Y DE ESTUDIOS AVANZADOS DEL INSTITUTO POLITÉCNICO NACIONAL, México, D.F (MX)

(72) Inventors: Sandra Martínez Jarquín, Oaxaca (MX); Robert Winkler, Guanajuato (MX)

(73) Assignee: Centro de Investigación y de Estudios Avanzados del Instituto Politécnico Nacional, Mexico City (MX)

( * ) Notice: Subject to any disclaimer, the term of this patent is extended or adjusted under 35 U.S.C. 154(b) by 0 days.

(21) Appl. No.: 14/433,008

(22) PCT Filed: Oct. 7, 2013

(86) PCT No.: PCT/IB2013/059162
§ 371 (c)(1),
(2) Date: Apr. 1, 2015

(87) PCT Pub. No.: WO2014/057409
PCT Pub. Date: Apr. 17, 2014

(65) Prior Publication Data

US 2015/0262804 A1 Sep. 17, 2015

(30) Foreign Application Priority Data

Oct. 8, 2012 (MX) .................... MX/a/2012/011702

(51) Int. Cl.
*H01J 49/24* (2006.01)
*H01J 37/00* (2006.01)

(Continued)

(52) U.S. Cl.
CPC ............ *H01J 49/105* (2013.01); *H05H 1/2406* (2013.01); *H05H 2001/2437* (2013.01); *H05H 2001/2443* (2013.01)

(58) Field of Classification Search
CPC ..................... H01J 37/32009; H01J 37/32348; H01J 37/00; H01J 49/0027; H01J 49/24; H01J 49/26; H01J 49/02; H01J 49/04; H01J 49/0409; H01J 49/10
USPC ...................................... 250/288, 423 R, 282
See application file for complete search history.

(56) References Cited

U.S. PATENT DOCUMENTS 5,909,086 A * 6/1999 Kim .................. H01J 37/32009 315/111.21
8,253,098 B2 * 8/2012 Hiraoka ................ H01J 49/165 250/288

(Continued)

*Primary Examiner* — David A Vanore
(74) *Attorney, Agent, or Firm* — Andrew C. Aitken

(57) ABSTRACT

The present invention relates to a non-thermal plasma jet device as spatial ionization source for ambient mass spectrometry of the type which allows a free adjustment of the geometry of the plasma beam, wherein the device comprises a double dielectric barrier probe of non-thermal plasma or NTP probe, which generates a non-thermal plasma jet; a high voltage and high frequency transformer circuit that connects an outer electrode through which it is possible to perform a discharge for the ionization of a gas which produces plasma, and wherein said plasma generator circuit is in turn connected to a source of AC power; an inner electrode which is grounded and allows to perform the discharge for the production of plasma; a storage tank of a gas serving as discharge gas; a test sample on which the non-thermal plasma jet is applied; and a ion transfer adapter to direct the ions produced by the device from the vacuum-free sample into a mass analyzer. The device described allows to directly analyzing live samples (plants, for example) without causing any damage to them.

12 Claims, 7 Drawing Sheets

(51) Int. Cl.

| | |
|---|---|
| ***H01J 49/04*** | (2006.01) |
| ***H01J 49/10*** | (2006.01) |
| ***H05H 1/24*** | (2006.01) |

(56) References Cited

U.S. PATENT DOCUMENTS

| | | | | | |
|---|---|---|---|---|---|
| 8,519,354 | B2 * | 8/2013 | Charipar | H01J 49/105 | 250/282 |
| 8,545,669 | B2 * | 10/2013 | Mahoney | H01J 37/32935 | 156/345.24 |
| 9,184,036 | B2 * | 11/2015 | Cooks | H01J 49/0445 | 250/281 |
| 9,184,037 | B2 * | 11/2015 | Kumano | H01J 49/0409 | 250/281 |
| 9,184,038 | B2 * | 11/2015 | Cooks | H01J 49/067 | 250/281 |
| 2010/0258717 | A1 * | 10/2010 | Chen | H01J 49/0431 | 250/288 |
| 2010/0301209 | A1 * | 12/2010 | Ouyang | H01J 49/0495 | 250/288 |
| 2011/0168881 | A1 * | 7/2011 | Sturgeon | H01J 49/145 | 250/282 |
| 2013/0146759 | A1 * | 6/2013 | Ouyang | H01J 49/0495 | 250/282 |

* cited by examiner

NON-THERMAL PLASMA JET DEVICE AS SOURCE OF SPATIAL IONIZATION FOR AMBIENT MASS SPECTROMETRY AND METHOD OF APPLICATION

FIELD OF THE INVENTION

The present invention relates generally to the implementation of a plasma jet device as source of ionization, and particularly to a non-thermal plasma jet device as spatial ionization source for ambient mass spectrometry.

BACKGROUND OF THE INVENTION

The term "plasma" describes a gaseous particle system containing balanced charges of free ions and electrons. In contrast to the quasi-neutrality of plasma, the charge carriers cause various physical phenomena, such as the electric conductivity of plasma, the appearance of oscillations, and the formation of boundary sheaths if in contact with solid surfaces. Depending on its temperature, plasma can be described as either low-temperature plasma (LTP), or high-temperature plasma (HTP). Plasma generated at ambient conditions, i.e. about 300K and at atmospheric pressure, is denoted as non-thermal plasma (NTP).

Devices generating a free NTP jet, so-called "cold plasma jets" or "NTP probes," allow the localized application of plasma to objects. Several technical designs for the generation of cold plasma beams have been reported. Many such devices are based on the principle of a dielectric-barrier discharge (DBD) and are characterized by the coverage of at least one electrode with dielectric material. High voltages and high frequencies drive the generation of plasma. Typically, the geometry, i.e., the length and diameter of the plasma jet, is determined by the geometry of the NTP device.

NTP jets enable numerous technical applications. Recently, the use of NTP-based devices was introduced for the ionization of molecules and their subsequent analysis using mass spectrometry. This strategy does have various advantages compared to conventional ionization methods, most remarkably the operation at ambient conditions and the possibility of screening large samples.

According to a review on the state of the art, current proposals in the field of interest are as follows:

The invention called "Inductively coupled plasma mass spectrometer" for the U.S. Pat. No. 6,265,717 granted on Jul. 24, 2001, where Kenichi Sakata et. al., disclosed an apparatus and method for inductively coupled plasma mass spectrometry (ICP-MS) with improved detection limits. The ICP-MS includes the devices for generating inductively coupled plasma (ICP) in a gas at substantially atmospheric pressure to ionize a sample, a mass analyzer (MS) operable at a low pressure of $10^{-2}$ to $10^{-4}$ Pa for detecting at least part of the sample ions, and an interface for transferring the sample ions from the ICP to the MS. The interface is provided with a regulator to increase the interface pressure of its normal pressure; for example, from 350 to 450 Pa. The increased pressure may reduce the sensitivity of the instrument, but can improve the detection limits by reducing the ion-selective interference.

The U.S. Pat. No. 6,248,998 granted on Jun. 19, 2001 to Toyoharu Okumoto, et al., entitled "Plasma ion source mass spectrometer" discloses an ion mass spectrometer comprising a plasma ion source for ionizing a sample with plasma; a mass filter for subjecting the sample ionized by the plasma ion source to mass spectrometry; and an interface unit having an orifice formed in a cone for introducing the ionized sample ionized by the plasma ion source into the mass filter. Further, the plasma ion source mass spectrometer comprises a first cooler for cooling a plasma generator of the plasma ion source and a plasma-generating power source; and a second independent cooler for cooling the interface unit and for raising the temperature by changing the cooling efficiency to reduce the influence of deposition on the interface unit. With this construction, the temperature of the interface unit can be controlled without changing the analysis sensitivity of the plasma ion source mass spectrometer.

By the other hand, U.S. Pat. No. 5,616,918 granted on Apr. 1, 1997 to Konosuke, Oishi, et. al., discloses the invention "Plasma ion mass spectrometer and plasma mass spectrometry using the same," referring to a plasma ion mass spectrometer capable of improving detection accuracy in mass spectrometry by reducing background noise owed to ultraviolet radiation and neutral particles and ion mass spectrometry using the same plasma. A sample is ionized with a plasma-generating portion. The ionized sample flow is shielded by a shielding means after an elapse of a specified time, and the ions of the sample accumulated before shielding the flow of the ionized sample are held for a specified time. Then, mass spectrometry is performed for ions of the sample held for the specified time. While the sample ions accumulate before shielding, ultraviolet radiation mixed with the ions of the sample disappears. Hence, only the ions of the sample can be held. So the background noise is reduced, and the detection accuracy in mass spectrometry is improved.

Finally, U.S. Pat. No. 5,223,711 granted to Neil Sanderson and Christopher Tye on Jun. 29, 1993 discloses the invention "Plasma sources mass spectrometry," referring to an improved apparatus and method for plasma source mass spectrometry, the apparatus comprising means for generating plasma at substantially atmospheric pressure in a gas; means for introducing a sample to the plasma wherein the sample is ionized to form sample ions; means for transmitting the ions from the plasma into an evacuated chamber; a mass filter disposed within the evacuated chamber; a substantially non-multiplying ion detector comprising an ion collector, the detector being responsive to the charge of at least some of the sample ions which pass through the mass filter; and means for inhibiting the response of the detector to electrically neutral particles. Typically, the detector comprises a suppressor and means for negatively biasing the suppressor with respect for the collector, and a shield disposed to shield the suppressor from the neutral particles. Improvements include a greater dynamic range with reduced sensitivity to noise.

Biomedicine is another area of potential importance for NTP jets. Several reports describe the efficient inactivation of microbes and spores. This could be harnessed, for example, to sterilize root canals in teeth. Human cells could undergo low-temperature plasma treatment in vitro without causing any detectable damage. However, still more information is required to assess the safety of the application of plasma. Particularly, there is a lack of in vivo studies evaluating the effect of NTP on intact higher organisms.

In the present patent application entitled "Non-thermal plasma jet as source of spatial ionization source for ambient mass spectrometry and method for its application", we present a novel device comprising an NTP jet based on a double discharge dielectric barrier from which the NTP jet coupled to a mass spectrometer can detect chemical compounds directly from an intact organism without causing significant damage.

OBJECTIVES OF THE INVENTION

An objective of the present invention is to provide a non-thermal plasma jet as spatial ionization source for ambient mass spectrometry.

Another objective of the present invention is to provide a non-thermal plasma jet as spatial ionization source for ambient mass spectrometry with a double dielectric barrier probe (DDBD), which allows trouble-free adjustment of the geometry of the plasma beam.

Another objective of the present invention is to provide a non-thermal plasma jet as spatial ionization source for ambient mass spectrometry, which allows the adjustment of the beam by an insert.

Another objective of the present invention is to provide a non-thermal plasma jet as spatial ionization source for ambient mass spectrometry, which allows the analysis based on mass spectrometry of the compounds in living organisms, environmental conditions, and without causing a major damage to the elements under study.

Still another objective of the present invention is to provide a non-thermal plasma jet as spatial ionization source for ambient mass spectrometry, which comprises an adapter for transferring ions between the application area of the NTP jet to the sample and the detector mass.

The objectives of the present invention referred above and others not yet mentioned will become apparent from the description of the invention and the figures attached, which are provided with an illustrative but not limitative character to the scope of the invention.

DETAILED DESCRIPTION OF THE INVENTION

Figure 1:
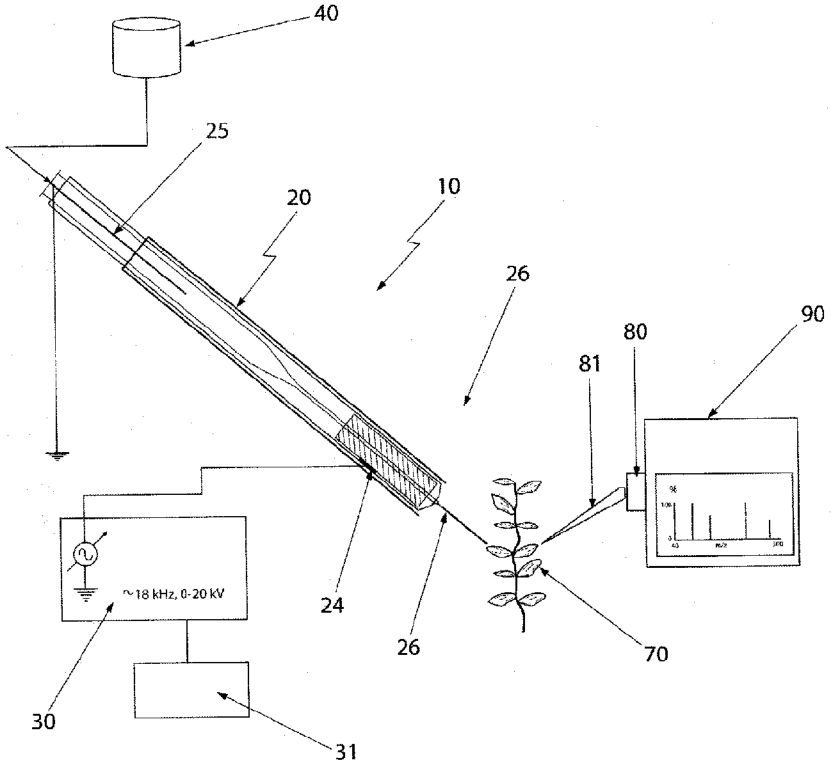
FIG. 1. Shows a schematic diagram of the elements that integrate a non-thermal plasma jet as spatial ionization source for ambient mass spectrometry according to the present invention.

According to what is shown in FIGS. 1 to 14, the present invention consists of a non-thermal plasma jet device as spatial ionization source for ambient mass spectrometry 10, hereinafter device 10, wherein said device comprises a double dielectric barrier probe (DDBD) or NTP probe 20 that generates a non-thermal plasma jet 26; a high voltage (0-20 kV) and a high frequency (18 kHz) 30, which connects to an outer electrode 24 through which it is possible to perform a discharge for ionizing a gas that produces plasma; said plasma generator circuit connects to a source of AC power 31 (127 V AC, 60 Hz); an inner electrode 25, which is grounded and performs the discharge for producing plasma, wherein both electrodes, the outer 24 and the inner 25 electrodes are comprised within the NTP probe 20; a storage tank 40 of a gas that can be any gas in theory, e.g. He, Ne, $O_2$, $N_2$ or water vapor, which serves as discharge gas; a test sample 70 on which the non-thermal plasma jet 26 is applied; and an ion transfer adapter 80 to direct the ions 81 produced by the device 10 from the vacuum-free sample 70 to a mass analyzer.

To measure sample 70 with this configuration of the device 10, the power source 31 must be fed to transformer circuit 30 and the gas flowing to produce plasma; the jet 26 impinges on the sample 70, and the ions 81 enter by the ion transfer adapter 80 into the mass spectrometer 90, where they are processed by the mass equipment obtaining mass spectra that can be interpreted with the software of the equipment used (mass spectrometer 90). The exposure time of the sample 70 is in relation to the mass equipment used and to the measurements required, where the cycle ranges from approximately 3 to 60 seconds, and the gas flow used is 0.5 L/min.

Figure 2:
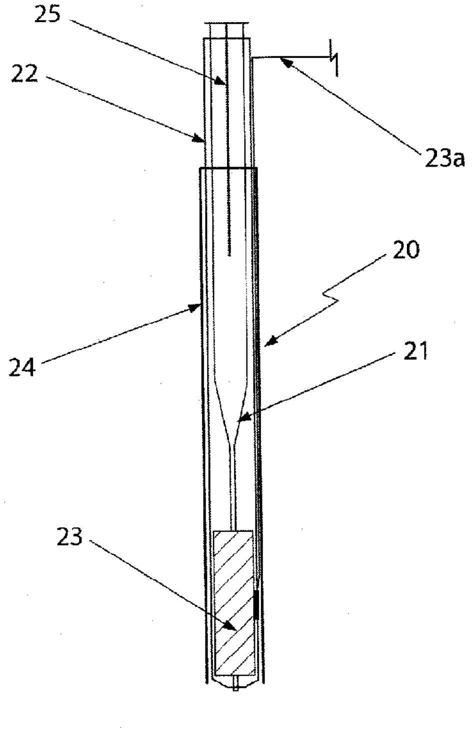
FIG. 2. Shows a front elevation view of a double dielectric barrier probe (DDBD) of non-thermal plasma, which is an integral part of the device of FIG. 1.
Figure 3:
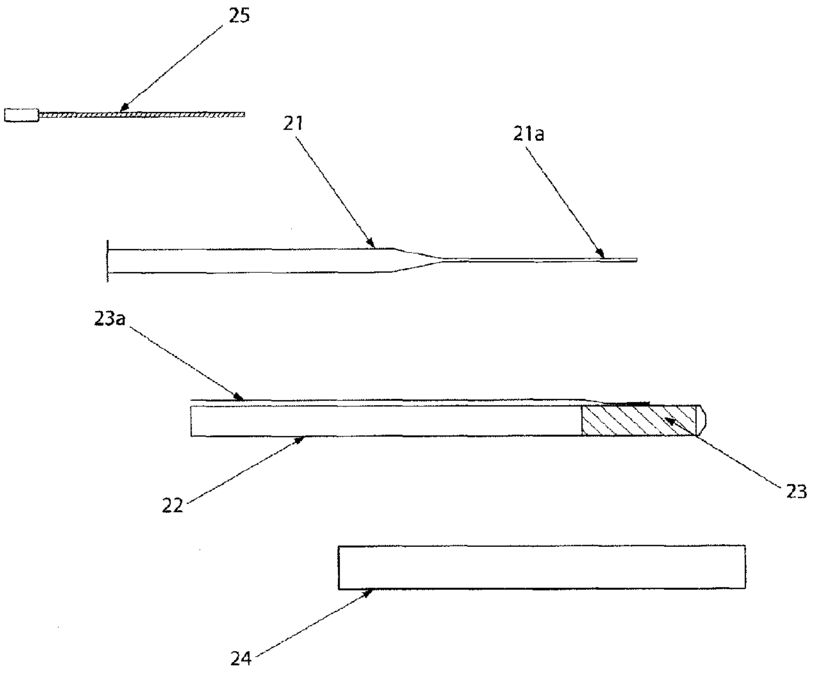
FIG. 3. Shows from a frontal elevation view a partially exploded view of the double dielectric barrier probe (DDBD) of non-thermal plasma of FIG. 2.

As illustrated in FIGS. 2 and 3, the double dielectric barrier probe (DDBD) of non-thermal plasma or NTP probe 20 is integrated from an inner electrode 25 that is grounded and preferably produced from Nichrome of 48 mm long and 0.3 mm in diameter, or any other corrosion-resistant and good electrical conductor metal, such as copper, stainless steel, and some other alloys; a plasma adapter 21 also identified as second dielectric barrier inside which the inner electrode 25 is arranged, wherein this plasma adapter 21 strengthens the properties of a first dielectric barrier 22 producing a softer and more effective discharge and allowing the control of the plasma diameter by changing the diameter of the tip 21*a* of the adapter 21, wherein said plasma adapter 21 is made from glass tubes of varying diameters on the tip or from materials with a low dielectric constant such as for example quartz, Teflon, ceramic, or high temperature resistant plastics; a dielectric barrier 22 within which the second dielectric barrier 21 and the inner electrode 25 are located, wherein the use of this dielectric barrier 22 in the device 10 prevents discharge from being direct and allowing energy to be distributed over the entire surface of the dielectric material, which is made from glass or materials with a low dielectric constant, such as quartz, ceramic, Teflon, or high-temperature resistant plastics; over this dielectric barrier 22 in the opposite end to within which the second dielectric barrier 21 and the inner electrode 25 are introduced, a second outer electrode 23 has been configured, preferably made from a copper stripe of 40 mm width coiled on said dielectric barrier 22, wherein the stripe can also be made of other corrosion resistant metals and good electricity conductors; said outer electrode 23 being connected through a cable 23*a* to the high voltage and high frequency transformer 30, allowing to perform the discharge for ionization of gas; and finally, the NTP probe 20 comprises a safety barrier 24 that protects the operator of the device 10 from electric shock, isolating the production of ozone, wherein this security barrier 24 is preferably made of glass tube, or tubes, or any insulating material to withstand high temperatures and with a low dielectric constant, such as, for example, quartz, ceramic, or high-temperature resistant plastics.

In a preferred embodiment of the present invention, the high voltage transformer circuit 30 is, for example, of the Ramsay PG-13 type, wherein for optimum performance with DC voltage, the rectifier diodes are replaced by solid wiring, and an adjustable power supply of 127 VAC, 60 Hz is employed as input source power. This transformer circuit 30 provides an amplification of approximately 800 times the input voltage. The output voltage can vary from 1.4-12 kV. The output frequency is stable to about 15 kHz. The greatest possible energy circuit absorption is 22 W; however, in normal operating conditions of the input voltage of 7 V (corresponding to the output voltage of 6 kV), power absorption is about 3 W. Interestingly, an input voltage higher than 9 V (an output voltage of approximately 7.5 kV), both the power consumption of the circuit and the plasma temperature increase drastically. Obviously, in this variation air-cooling becomes insufficient. At a voltage of 7 V, which was used for all experiments in the present invention, we determined a stable plasma temperature of 37° C. at a distance of 15 mm.

In measuring the temperature of the plasma, we initially employed a MiniiiIR$^{MR}$ Traceable® infrared thermometer; however, the observed readings showed high variability. Therefore, the temperature of the plasma was measured using a mercury thermometer at 15 mm from the electrode tip. Values were taken 30 seconds after setting the voltages of the plasma generator, to allow stabilization of the temperature of the plasma jet.

Figure 4:
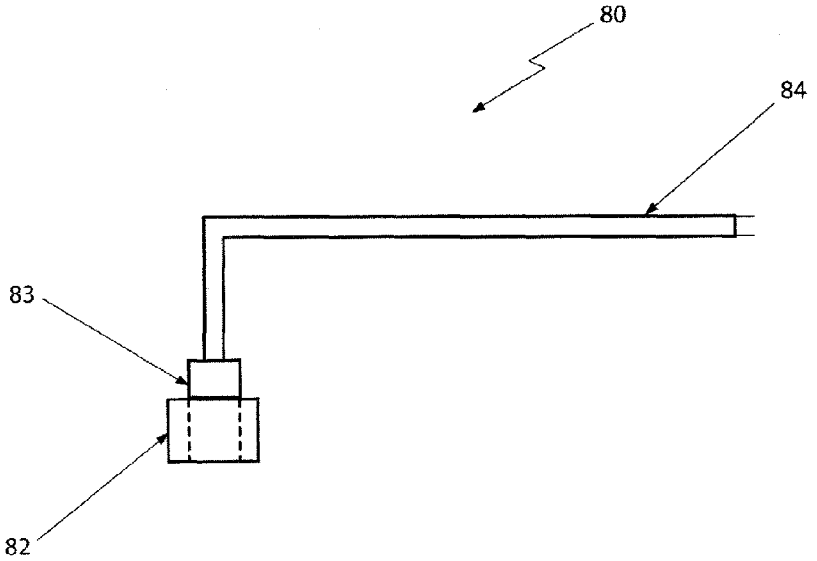
FIG. 4. Shows a top view of an adapter for ion transfer, which is an integral part of the device of FIG. 1.
Figure 5:
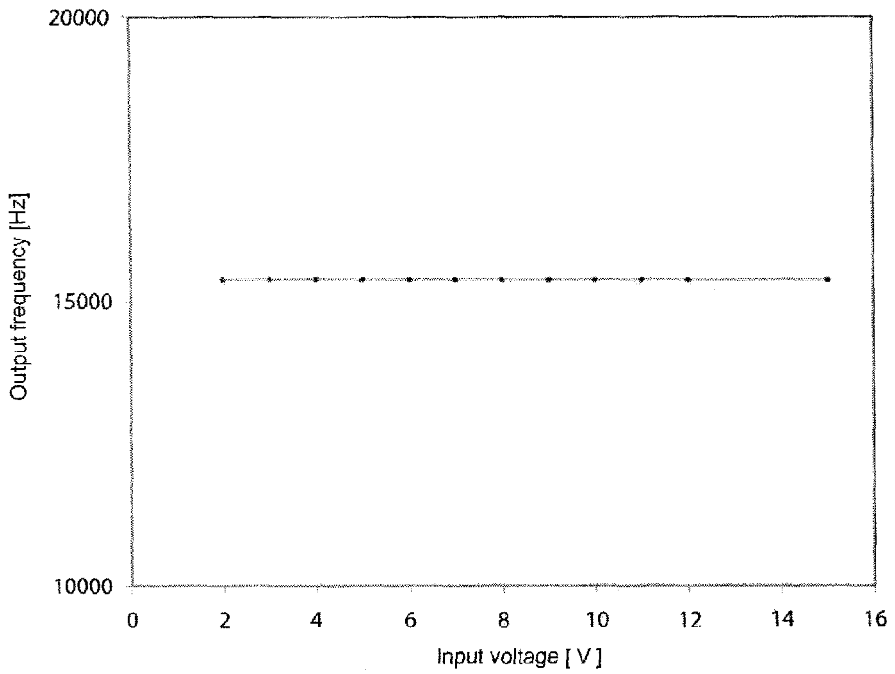
FIG. 5. Shows a graph representing the behavior of an output frequency to an input voltage in the device of FIG. 1.
Figure 6:
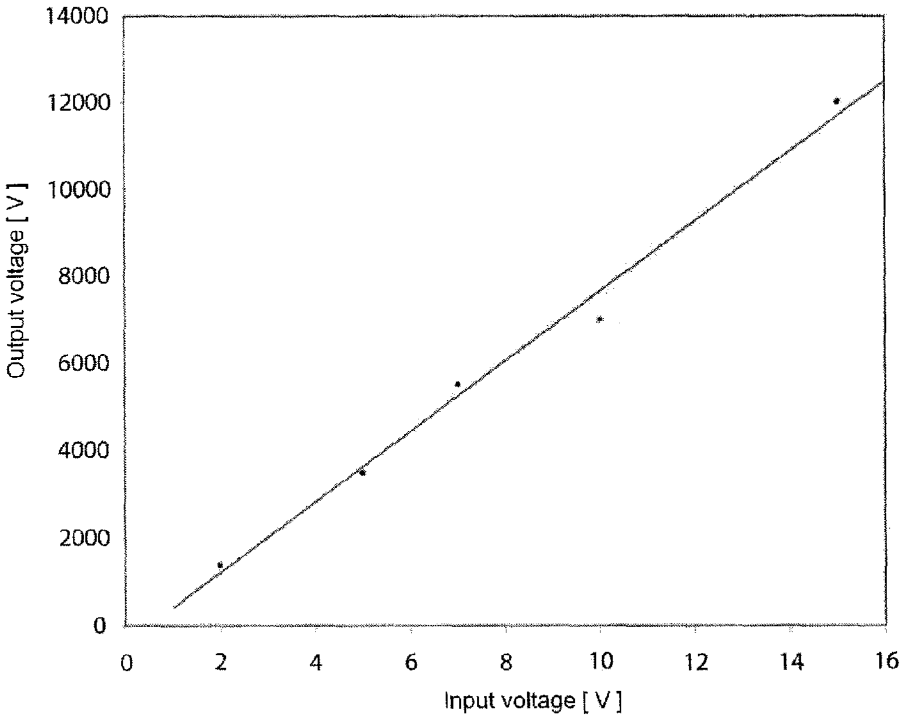
FIG. 6. Shows a graph, which represents the behavior of an output voltage to an input voltage in the device of FIG. 1.
Figure 7:
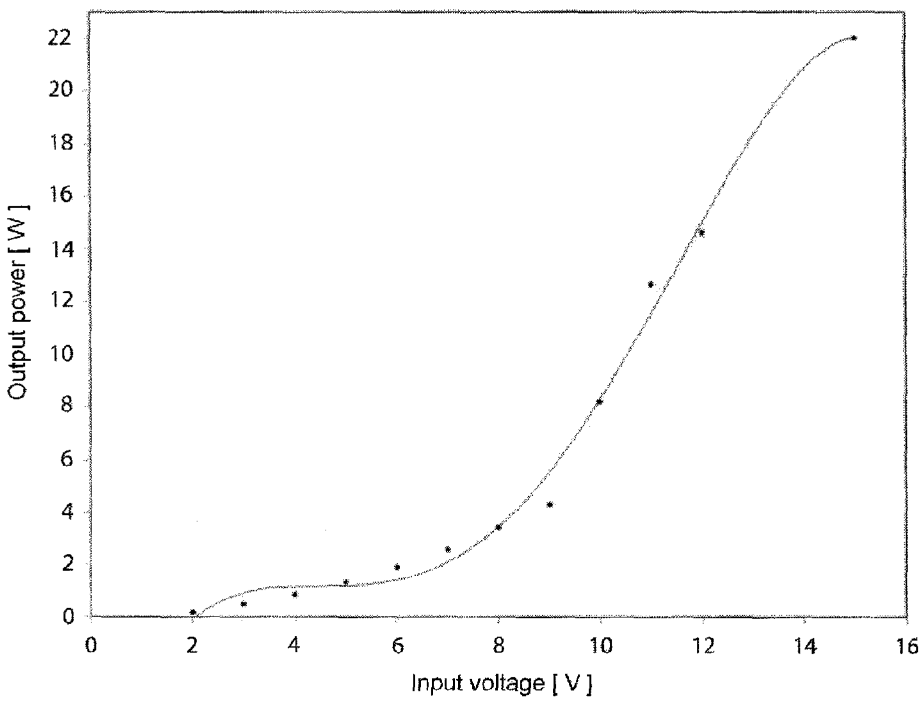
FIG. 7. Shows a graph representing the output energy behavior in relation to an input voltage in the device of FIG. 1.
Figure 8:
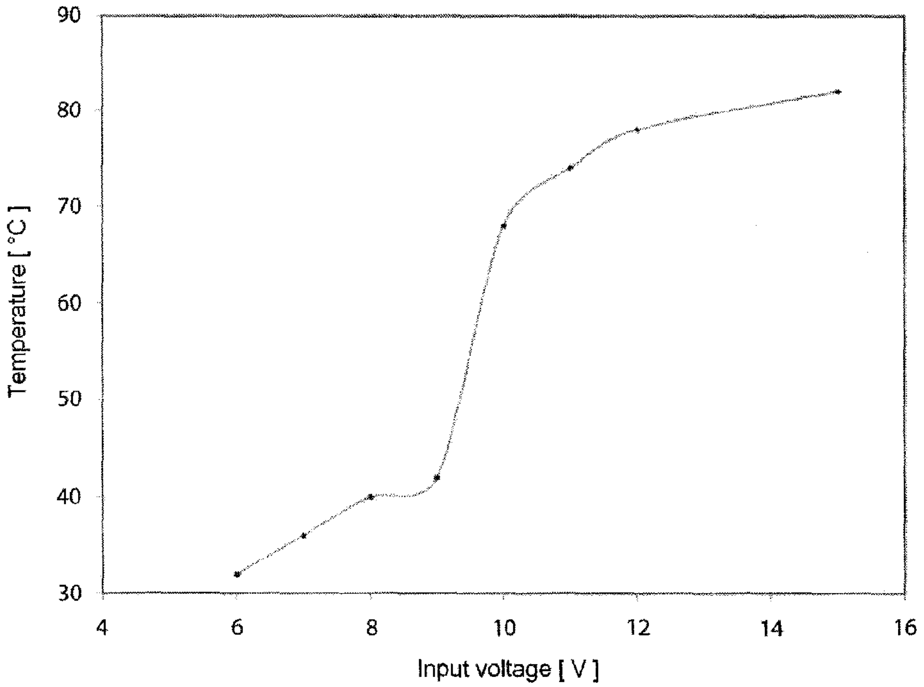
FIG. 8. Shows a graph representing the behavior of temperature to the input voltage in the device of FIG. 1.

The ion transfer adapter 80, which allows to direct ions 81 produced by the device 10 from the vacuum-free sample 70, was constructed as shown in FIG. 4, and it is particularly integrated by a nozzle 82, inside which a glass tube 83 is located and where ions 81 are received, which lead to a mass detector 90 via a stainless steel tube 84. The mass detector can be, for example, one of the quadrupole types.

The device 10 is operated at a low flow rate of argon gas of 0.5 L/min, while the electrical components and the plasma adapter 21 to guide the plasma gas are separated functionally, wherein the diameter of the NTP bean 26 can be modified without changing the disposition of the electronic probe 20. FIGS. 4 to 7 summarize the output frequency, the output voltage, and the power output of the circuit relative to the input voltage and the resulting NTP temperature.

Compared to the operation of a probe without insert (not shown), in the device 10 the plasma temperature, the production of ozone, and the risk of generation of an arc reduced significantly. All these improvements are usually attributed to the increased constructive separation between the outer high voltage electrode 24 on the outside and the electrically conductive plasma bean 26. Additionally, a cooling fluid could be inserted in the free space between the outer 24 and the inner electrode 25 to control the temperature of the NTP jet 26.

The following examples are presented for the sole purpose of illustrating the invention without implying any limitations on its scope.

EXAMPLE 1

Mass Spectrometry Using the Device of the Present Invention

Figure 9:
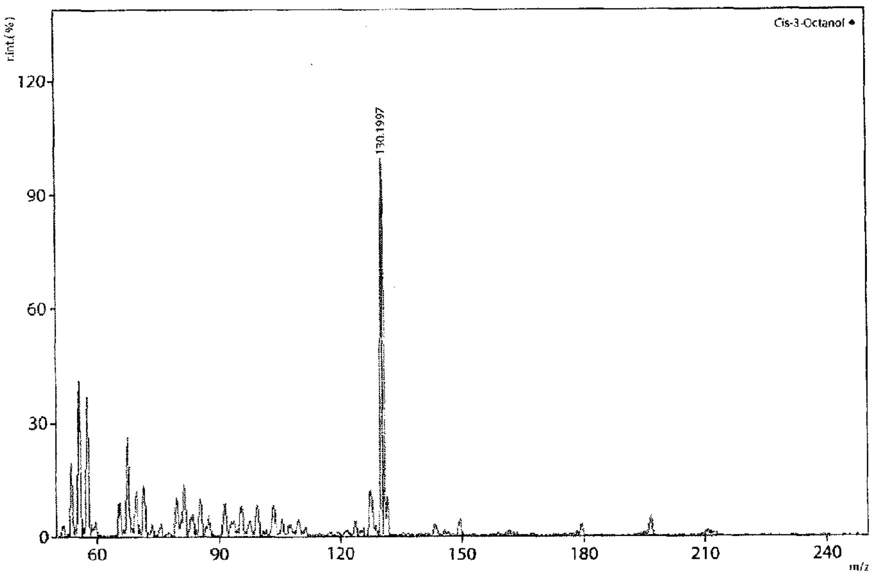
FIG. 9. Shows a detection graph of Cis-3-octanol placed on a leave of *Montanoa tormentosa* performed from the implementation of the device of FIG. 1.

According to the present invention, the cis-3-octanol that was applied to a leaf of *Montanoa tormentosa* can be detected from device 10 with a satisfactory signal-to-noise ratio as shown in FIG. 9. The spectrum is one measured by mass spectrometry with electro-spray ionization. The leaf was slightly damaged locally and after the measurements. Therefore, we can establish that NTP-based ionization allows an analysis based on mass spectrometry on the compounds of living organisms, as long as the corresponding limits for tissues investigated are respected.

EXAMPLE 2

Effect of Applying NTP in Insects

In a study conducted in the present invention to achieve the above reported results, we included three different species of insects; namely, *Prostephanus truncatus* (coarse grain borer), *Tribolium castaneum* (thick beetle of flour), and *Zabrotes subfasciatus* (Mexican weevil). All are insect pests and were obtained after three weeks of growth. The insects were subjected to three different plasma treatment times (10, 20, and 30 sec); during each exposure, we defined three groups of five individual insects. The plasma treatment in the first group was applied on the entire surface of the insect by moving the NTP probe. Another group of five individuals for each species were subjected to treatment with localized plasma (abdomen). Fifteen insects of each species were treated with argon gas during the same time that the insects in the NTP treatment group, and other 15 insects of each species were preserved as negative control without any treatment. The systemic damage was assessed as dead or alive. The local damages were investigated using a stereo microscope.

Figure 10:
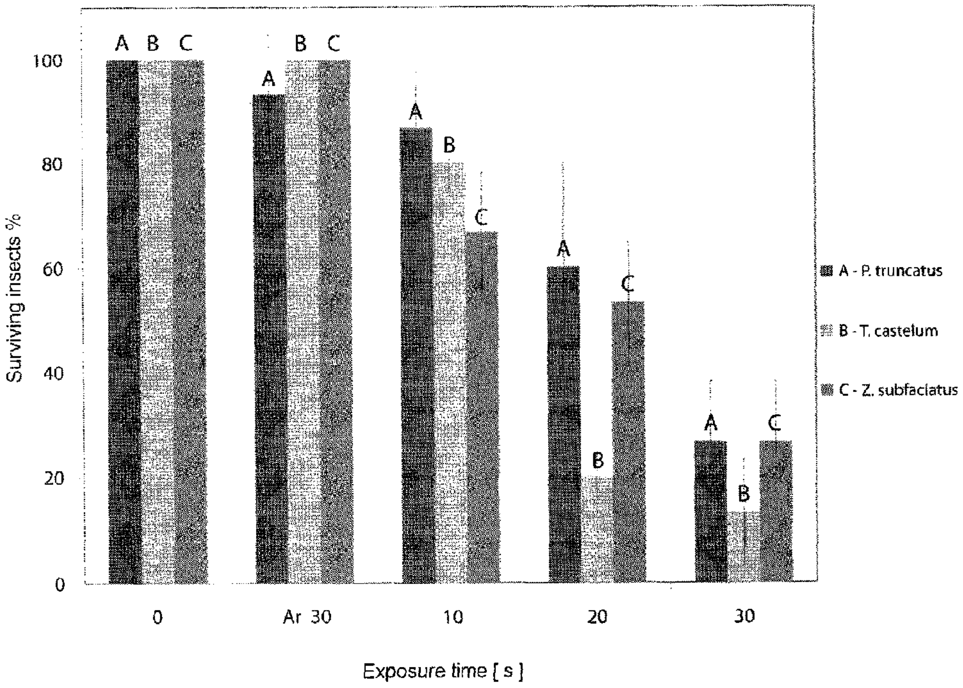
FIG. 10. Shows a graph representing the survival of insects to the exposure time in an NTP treatment in their abdominal region.
Figure 11:
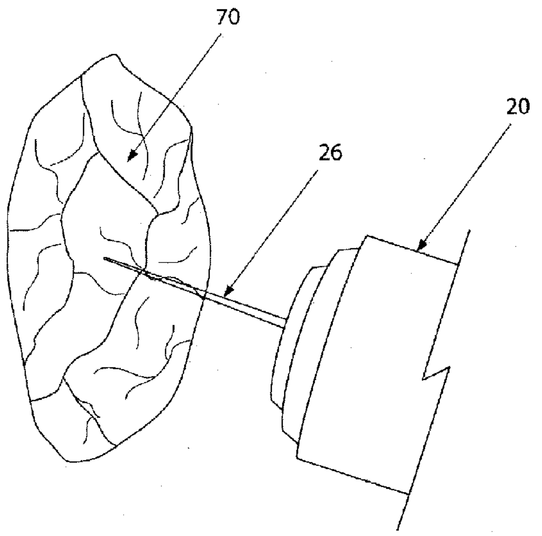
FIG. 11. Shows a schematic representation of the application of an NTP jet to a tobacco leaf.
Figure 12:
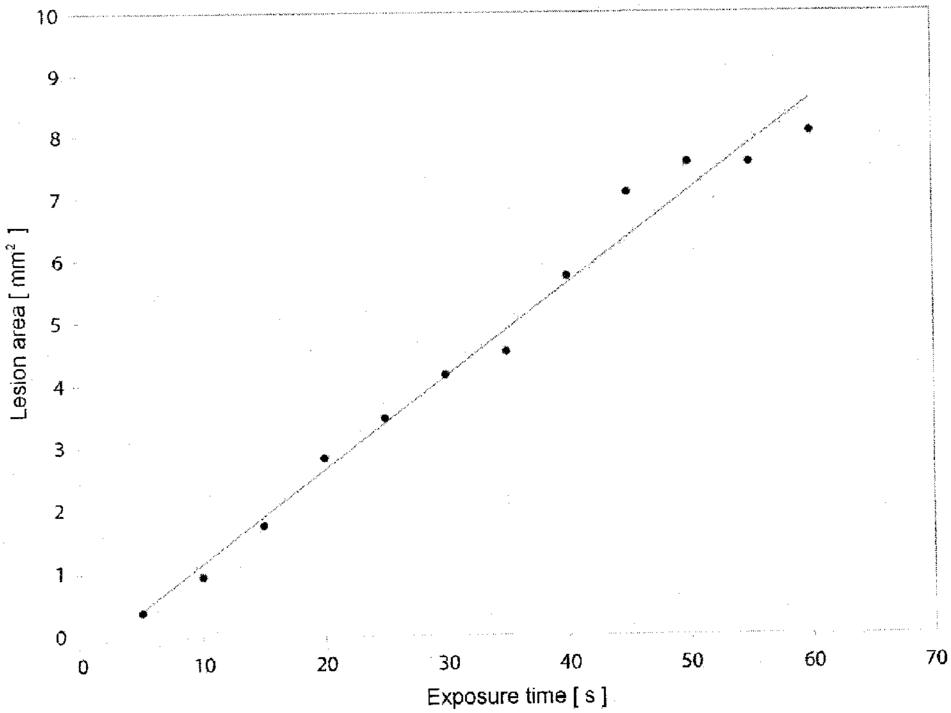
FIG. 12. Shows a graph representing the local damage to tobacco leaves to the time of exposure in a plasma treatment.

As shown in FIG. 10, the surviving rate of the three species of insects investigated decreased significantly with local plasma abdominal application of NTP. While approximately 80% of the insects survived with 10 sec of NTP treatment, over 70% of the insects died after 30 sec. The suffocation of the insects owed to the air displacement through the plasma gas can be excluded, because the control group, which was exposed to argon during the same time, did not exhibit an increased mortality compared with the negative control group. Microscopic studies revealed lesions in the abdomen of dead insects, which were not present in the survivors. Differences in tolerance to NTP jet treatment between species can be normalized using a different structure from their exoskeletons. By contrast, 30 sec of distributed application of the NTP jet did not affect the survival rate of any of the three tested species of insects.

EXAMPLE 3

Effect of NTP Application to Plants

Different experiments were also performed on three plant species of *Nicotiana tabacum* (tobacco), *Capiscum annuum* (chili), and *Arabidopsis thaliana*.

Plants of *Nicotiana tabacum* var. Xhanti to investigate the damaged region of the leaves were left to grow during 3.5 months at 28° C. under greenhouse conditions. The leaves were exposed to NTP jet during 10 to 60 seconds. Subsequently, we measured the diameter of the damaged region using a sliding gauge. Each treatment was performed on the same leaf at three different locations of spots. Negative controls; namely, the application of argon for 60 sec, were performed on the same plant.

Chili plants were subjected to experiments at three months of growth. Six healthy plants were included in the study. The plasma was applied to young leaves. For each plant, three leaves were treated with LTP for a defined time (10 to 60 sec). Three other leaves of the plant were exposed to the NTP jet over a different interval. We applied only argon gas during 60 sec to the three leaves. A plant was preserved as negative control without any treatment. The damage was evaluated on a scale according to the visual intensity of the lesion caused by the plasma as normal, mild, moderate, and severe.

*Arabidopsis thaliana* plants var. Columbia were collected from the greenhouse to the age of one month. Four groups of three individual plants were added and subjected to different treatments; the plants of the first group were subjected to NTP exposure of 60 sec and the plants of the second group to NTP exposure of 30 sec. The third group was used as negative control. Of those, one plant was treated once with argon for 60 sec, another daily, and the third was left without any treatment. The condition of the plants after the treatment was evaluated as dead, damaged, or normal.

All plants were maintained at the same controlled conditions and observed during a week after the experiments.

Here, we could observe gradual damages depending on the exposure time for the NTP application to chili leaves. To 30 sec from the application of the NTP jet, only marginal damages were observed; 40 sec led to medium damages, and 50 sec and 60 sec resulted in severe damages to the leaves of the plants. The evaluation of the damaged regions on tobacco plants as a function of the time of exposure resulted in a surprisingly linear correlation (see FIGS. 11 and 12). The short application of NTP resulted only in damaged regions of approximately the jet diameter. However, increased intervals of treatment resulted in the expansion of the damaged region. This phenomenon is in agreement with the hypothesis of a thermal effect as the underlying mechanism of the damage.

*Arabidopsis thaliana* plants treated daily with 60 sec of NTP died on the second day. When the plants were treated only once simultaneously all the plants of the group died after three days indicating that this level of exposure is absolutely local for *Arabidopsis* plants. The main symptoms were burning leaves and dry appearance. However, when the time of exposure was reduced to 30 sec, the plants were able to recover, although this group presented a moderate damage and reduced growth compared with control plants.

Altogether these results show that the local and systemic effects after the application of the NTP jet to the leaves of the plants are gradual and correlated with the time of treatment with the NTP jet.

EXAMPLE 4

Effect of the Application of NTP to Seeds

The seeds of *Solanum lycopersicon esculentum* (tomato) used in the experiments were purchased at a local supermarket. For each treatment we used 10 seeds, and experiments were performed in triplicate. The treatments were 60 sec and 120 sec of exposure to NTP; 120 sec of argon gas; and negative controls without any treatment. Treatments were applied on both sides of a seed. After treatment, the seeds were planted in boxes with soil, with 10 seeds per box. The seeds of different treatments were planted in the boxes to offset the possible effects on soil. The boxes were watered daily. The seed germination and growth of the crops were monitored for 1 month to evaluate the survival and normal development.

Figure 13:
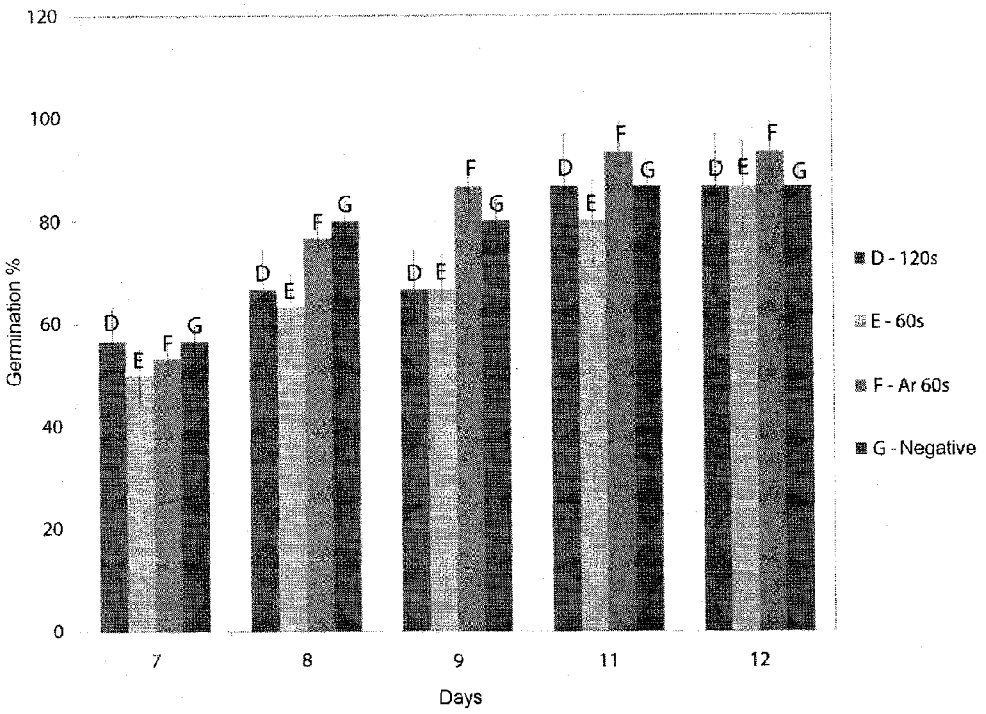
FIG. 13. Shows a graph representing the germination degree of tomato seed to the application or non-application of an NTP treatment.
Figure 14:
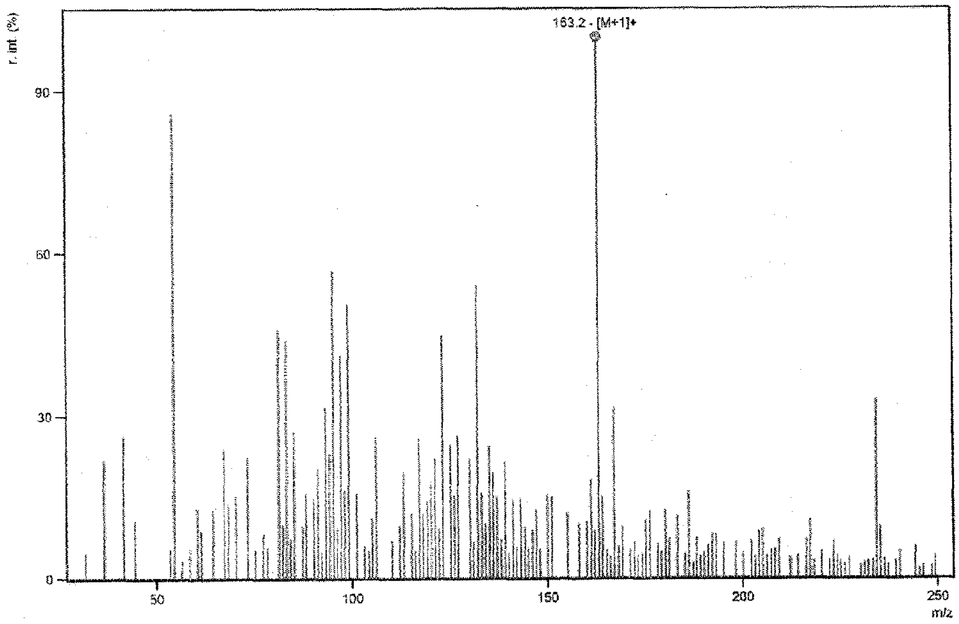
FIG. 14. Shows a graph representing a mass spectrum obtained directly from a green leaf of a live tobacco plant using the device of the present invention. The peak of the highest abundance corresponds to the nicotine protonated species [M+H]+.

Although tomato seeds were treated with up to 120 sec of NTP on both sides, their ability to germinate was not significantly affected, as shown in FIG. 13. This is surprising since all plant leaves experiments resulted in severe damage after an exposure of 60 sec and about 50% of the insects were exterminated after 20 sec of application of NTP. Considering the high sensitivity of the microbes to the treatment of plasma, the application of NTP jets to disinfect the seed material could be technically possible.

EXAMPLE 5

Mass Spectrometry Using the Device of the Present Invention on Tobacco Leaves From the tobacco plant (*Nicotiana tabacum*) containing alkaloid nicotine, which provides a characteristic aroma and has a mass of 162.12 Da, we obtained a mass spectrum (FIG. 14) directly from a green leaf of the living plant using the device of the present invention (NTP/MS), observing that the plant used did not suffer a greater damage than the local damage in the leaf. Although there are many peaks in the resulting spectrum (FIG. 14), the most abundant corresponds to the protonated species of nicotine [M+H]+.

Damage Observed and Possible Thermal Mechanism

Microscopic analysis of dead insects and regions of damaged plants present lesions suggesting a thermal mechanism. This is surprising, since the temperature of NTP was measured to be of 37° C. or lower. Its DBD disposal resulted in a discharge temperature of approximately 33° C., which is well below the critical temperature of 42° C., which initiates the destruction of cutaneous cells. However, the samples treated in the study include significantly higher proportions of water compared with insect exoskeletons and leaves. While pork contains about 73-75% water, the exoskeletons of arthropods have only approximately 13%. The water content of the plant leaves is quite valuable and highly dependent on environmental conditions. For tobacco leaves, the moisture content can be up to 90%, but it should be considered that the water is primarily stored in the mesophyll tissue of leaves and not in the outer protective layers, the epidermis and cuticle, which are exposed to the NTP jet. Water has a thermal isobaric capacity initially quite specific, $c_{p0}$ of 4181 J $Kg^{-1}$ $K^{-1}$ (at 298.15 K and 0.1 MPa); for this reason water content in organic tissues greatly influences the thermal capacity in general. Additionally, higher water content eases the dissipation of heat from a "hot spot" with its environment. The temperature of the NTP jet was stable and was below damaging values. Given the heterogeneous nature of plasma, there can be localized temperature peaks that are not compensated by the affected cells and thus, will lead to an irreversible biological damage. Although a heterogeneous temperature profile of the NTP jet could not be confirmed experimentally, the circular expansion of the lesions with prolonged application of the NTP jet to tobacco leaves supports this hypothesis. Additionally, the cuticle and the epidermal layers of tobacco leaves are destroyed with low preference moisture content. The definite form of the damaged regions and continuous circular progression makes unlikely a direct effect of ozone or ultraviolet radiation. However, heat damage symptoms could also be caused or supported by absorption of UV radiation generated by the plasma.

From a practical viewpoint, to clarify the exact mechanism is less important for mass spectrometric measurements than the knowledge of critical limits for a certain type of tissue. However, to develop medical applications based on NTP, all the possible risks to organisms could be addressed by the specific device, considering the micro-scale of possible homogeneities in temperature, UV radiation, ozone generation, but also the thermal capacity and dissipation rate of tissues treated.

Thus, from the above described configuration of the non-thermal plasma jet device as ionization source for spatial mass spectrometry 10 it is possible to notice that all the objectives of the invention originally defined and still others not specified are met, obtaining an invention entirely different from those hitherto known in the field of plasma jet devices as ionization source used in mass spectrometry.

The invention claimed is:

1. A non-thermal plasma jet device as spatial ionization source for ambient mass spectrometry of the type that allows a free adjustment of the geometry of the emerging plasma beam, wherein said device comprises a double dielectric barrier probe of non-thermal plasma or NTP probe, which generates a non-thermal plasma jet; a high voltage and high frequency transformer circuit connected to an external electrode through which it is possible to perform the discharge for gas ionization that producing plasma; wherein said plasma generator circuit is in turn connected to an AC power source; a grounded internal electrode, which allows to perform the discharge for producing plasma; a storage tank for a gas serving as discharge gas; a test sample on which the non-thermal plasma jet is applied; and a ion transfer adapter to direct the ions produced by the device from the vacuum-free sample to a mass analyzer.

2. The non-thermal plasma jet device as spatial ionization source for ambient mass spectrometry according to claim 1, wherein the double dielectric barrier probe of non-thermal plasma or NTP probe is integrated from a grounded inner electrode; a plasma adapter inside which the inner electrode is disposed; a dielectric barrier inside which are the second dielectric barrier and the inner electrode, which has at its end opposite to where the second dielectric barrier and the inner electrode are introduced, an outer electrode connected by a cable to a high voltage and high frequency transformer, thus allowing to perform the discharge for the ionization of the gas; and a safety barrier that protects the operator of the device from any electric shock, isolating the production of ozone.

3. The non-thermal plasma jet device as spatial ionization source for ambient mass spectrometry according to claim 2, wherein the inner electrode is preferably made of Nichrome with 48 mm long and 0.3 mm diameter or other corrosion-resistant metal and good electrical conductor, such as copper, stainless steel, and some alloys.

4. The non-thermal plasma jet device as spatial ionization source for ambient mass spectrometry according to claim 2, wherein the plasma adapter allows controlling the diameter of the plasma by changing the diameter of its head.

5. The non-thermal plasma jet device as spatial ionization source for ambient mass spectrometry according to claim 2, wherein the plasma adapter is made of glass tubes of varying head diameters or from materials with a low dielectric constant such as quartz, Teflon, ceramic, or high-temperature resistant plastics.

6. The non-thermal plasma jet device as spatial ionization source for ambient mass spectrometry according to claim 2, wherein the dielectric barrier is made of glass or materials with a low dielectric constant, such as quartz, ceramic, Teflon, or high-temperature resistant plastics.

7. The non-thermal plasma jet device as spatial ionization source for ambient mass spectrometry according to claim 2, wherein the outer electrode that is wound around the dielectric barrier is preferably made from a copper tape of 40 mm width, wherein said tape can also be of other metals resistant to corrosion and good electrical conductors.

8. The non-thermal plasma jet device as spatial ionization source for ambient mass spectrometry according to claim 2, wherein the security barrier is preferably made of glass tube or tubes of any insulating heat resistant materials with low dielectric constant such as quartz, ceramic, or high-temperature resistant plastics.

9. The non-thermal plasma jet device as spatial ionization source for ambient mass spectrometry according to claim 1, wherein the high voltage transformer circuit is a PG-13 Ramsay type, wherein for optimal performance for DC voltage, the rectifier diodes are replaced by solid wiring, and an adjustable power supply of 127 V AC, 60 Hz is employed as input power source.

10. The non-thermal plasma jet device as spatial ionization source for ambient mass spectrometry according to claim 1, wherein the ion transfer adapter is integrated with a nozzle within which is a glass tube that receives the ions, which are led to a mass detector via a stainless steel tube.

11. The non-thermal plasma jet device as spatial ionization source for ambient mass spectrometry according to claim 1, wherein the gas used can be He, Ne, $O_2$, $N_2$ and/or water steam.

12. The non-thermal plasma jet device as spatial ionization source for ambient mass spectrometry according to claim 1, wherein the mass analyzer is a quadrupole mass analyzer for micromasses.

* * * * *